United States Patent
Hwan

(10) Patent No.: US 7,459,345 B2
(45) Date of Patent: Dec. 2, 2008

(54) PACKAGING METHOD FOR AN ELECTRONIC ELEMENT

(75) Inventor: Lu-Chen Hwan, Taipei (TW)

(73) Assignee: Mutual-Pak Technology Co., Ltd., Xinzhuang, Taipei County (TW)

( * ) Notice: Subject to any disclaimer, the term of this patent is extended or adjusted under 35 U.S.C. 154(b) by 0 days.

(21) Appl. No.: 10/968,006

(22) Filed: Oct. 20, 2004

(65) Prior Publication Data

US 2006/0084191 A1     Apr. 20, 2006

(51) Int. Cl.
    *H01L 21/00*     (2006.01)
(52) U.S. Cl. .............. 438/121; 438/123; 438/124; 438/111; 438/112; 257/666; 257/676; 257/692; 257/781; 257/787
(58) Field of Classification Search .......... 438/121, 438/123, 124, 111, 112; 257/666, 676, 692, 257/781, 787
    See application file for complete search history.

(56) References Cited

U.S. PATENT DOCUMENTS

| | | | |
|---|---|---|---|
| 6,404,214 B1 * | 6/2002 | Muramatsu et al. | 324/754 |
| 6,667,190 B2 * | 12/2003 | Kung et al. | 438/107 |
| 6,911,624 B2 * | 6/2005 | Koopmans | 219/209 |
| 6,987,030 B2 * | 1/2006 | Mita | 438/106 |
| 7,023,022 B2 * | 4/2006 | Eliashevich et al. | 257/98 |
| 7,052,935 B2 * | 5/2006 | Pai et al. | 438/106 |
| 2002/0180064 A1 * | 12/2002 | Hwan et al. | 257/780 |

* cited by examiner

*Primary Examiner*—Thao X Le
*Assistant Examiner*—Thanh Y Tran
(74) *Attorney, Agent, or Firm*—Reed Smith LLP; Stanley P. Fisher, Esq.; Juan Carlos A. Marquez, Esq.

(57) ABSTRACT

A packaging method for an electronic element has: etching portions of a top surface of a metal board to form recesses between raised unetched segments and filling the recesses with a dielectric material of high density polymer; forming multiple solder balls respectively on the raised unetched segments; coating the solder balls with a thin flux layer; bonding contacts on a die respectively to the solder balls with the thin flux layer; injecting an encapsulant between the die and the metal board; sealing the die with an outer encapsulant; etching a bottom surface of the metal board to form multiple metal leads; coating the bottom surface of the metal board other than the metal leads with a solder resist; and conducting a continuity test. The solder balls are not formed directly on the fragile die so the packaging method can be used with any types of dies and has a good applicability.

10 Claims, 6 Drawing Sheets

PACKAGING METHOD FOR AN ELECTRONIC ELEMENT

BACKGROUND OF THE INVENTION

1. Field of the Invention

The present invention relates to a packaging method for an electronic element, and more particularly to a packaging method for an IC or an LED and that lowers the cost of the IC or LED package.

2. Description of Related Art

Semiconductors are used with virtually all electronic equipment including personal computers, cell phones and automated teller machines (ATM). These pieces of equipment all have printed circuit boards (PCB) with IC chips and other electronic elements derived from semiconductor technologies. One of the semiconductor technologies is a packaging technology.

With reference to FIGS. 9 and 10, a conventional packaging method for an integrated circuit (IC) or a light emitting diode (LED) in accordance with the prior art comprises:

bonding an IC die (70) or an LED die (70a) respectively to a lead frame (60) or a copper clad laminate (60a);

bonding multiple wires (71, 71a) respectively from multiple solder points on the IC die (70) and LED die (70a) respectively to multiple pins (61, 61a); and encapsulating the IC die (70) and LED die (70a) with an encapsulant (72, 72a) respectively to form an IC or LED device.

However, bonding wires (71, 71a) from the IC die (70) and the LED die (70a) respectively to the pins (61, 61a) have unpredictable affects on the physical characteristics of the IC and LED devices such as heat conduction, inductance and impedance. Furthermore, positioning and attaching the wires (71, 71a) significantly reduces the production rate of the IC or LED devices.

With reference to FIGS. 11, 12 and 13, another conventional packaging method in accordance with the prior art for an IC device is a flip-chip packaging method comprising:

attaching multiple solder balls (81) onto a top surface of a die (80);

flipping the die (80) to position the solder balls (81) at desired locations on a lead frame (91) or printed circuit board (90a);

melting and solidifying the solder balls (81) to securely bond the flipped die (80) to the lead frame (91) or printed circuit board (90a); and encapsulating the die (80) with an encapsulant (95, 95a).

The flip-chip packaging method prevents irregularities in the physical characteristics of the die caused by the bonding wires.

However, the flip-chip packaging method has the following disadvantages:

1. The solder balls (80) are made of tin (Sn) or an alloy of tin and lead (Pb). The process of attaching the solder balls (80) to the die (80) is complicated and tedious and takes time. To attach the solder balls (80), manufacturers must invest a lot of money to open an additionally production line with additional expensive processing equipment.

2. The die is made of a segment of a silicon wafer, GaAs or Sapphire that is fragile and the metal bonding pad is very poor on adhesion. Attaching solder balls (80) directly to the die (80) with a poor adhesion bonding pads has a high probability of damaging or destroying the die (80) during the packaging process. Some types of dies (80) are too thin or small to attach solder balls (80). The flip-chip packaging method can be used only in a small set of circumstances.

To overcome the shortcomings, the present invention provides a packaging method for an IC and LED to mitigate or obviate the aforementioned problems.

SUMMARY OF THE INVENTION

The main objective of the invention is to provide a packaging method for an IC or an LED that can be widely used, improves the production rate of an integrated circuit (IC) or light emitting diode (LED) device and lowers the cost of the IC and LED devices.

A packaging method for an integrated circuit (IC) or a light emitting diode (LED) in accordance with the present invention comprises: etching portions of a top surface of a metal board to form recesses between raised unetched segments and filling the recesses with a dielectric material of high density metal contain polymer; forming metal ball or solder balls on the raised unetched segments; coating the metal ball or solder balls with a thin metal paste layer; bonding contacts on a die respectively to the metal ball or solder balls with the thin metal paste layer,; injecting an underfill between the die and the metal board; sealing the die with an outer encapsulant; etching a bottom surface of the metal board to form multiple metal leads; coating the bottom surface of the metal board other than the metal leads with a solder resist; and conducting a continuity test.

Other objectives, advantages and novel features of the invention will become more apparent from the following detailed description when taken in conjunction with the accompanying drawings.

DETAILED DESCRIPTION OF PREFERRED EMBODIMENT

Figure 1:
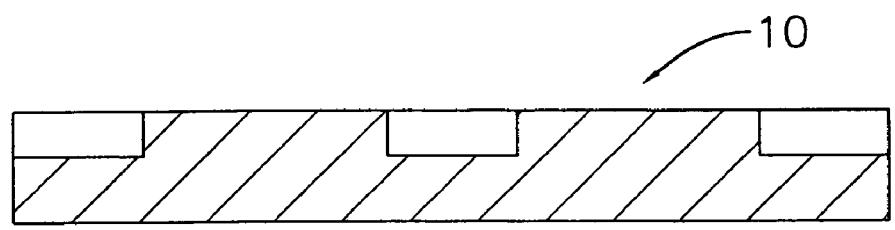
FIG. 1 is a cross sectional side view of an intermediate product formed during a packaging method for an integrated circuit (IC) and light emitting diode (LED) in accordance with the present invention.
Figure 2:
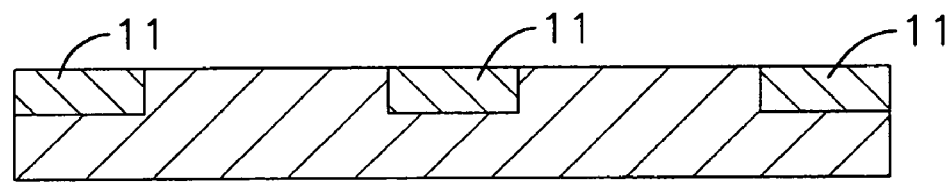
FIG. 2 is a cross sectional side view of an intermediate product formed during the packaging method for an IC and LED after the intermediate product in FIG. 1.
Figure 3:
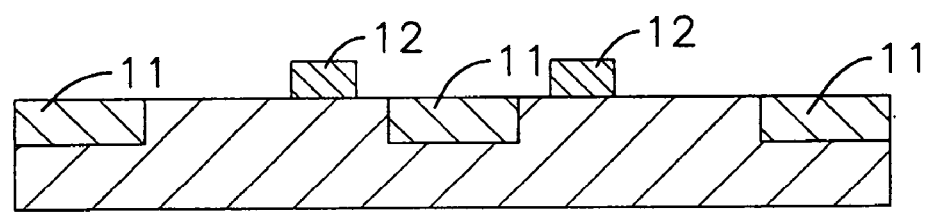
FIG. 3 is a cross sectional side view of an intermediate product formed during the packaging method for an IC and LED after the intermediate product in FIG. 2.
Figure 4:
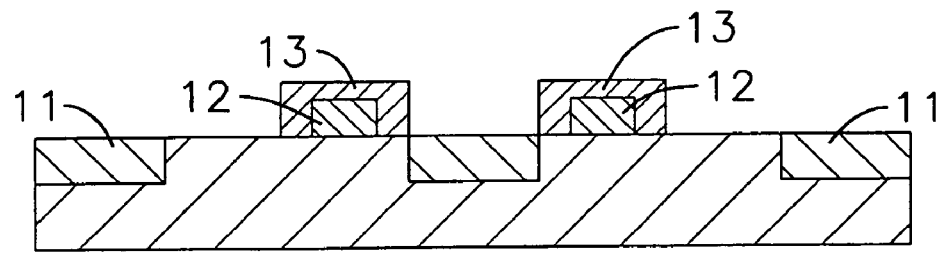
FIG. 4 is a cross sectional side view of an intermediate product formed during the packaging method for an IC and LED after the intermediate product in FIG. 3.
Figure 5:
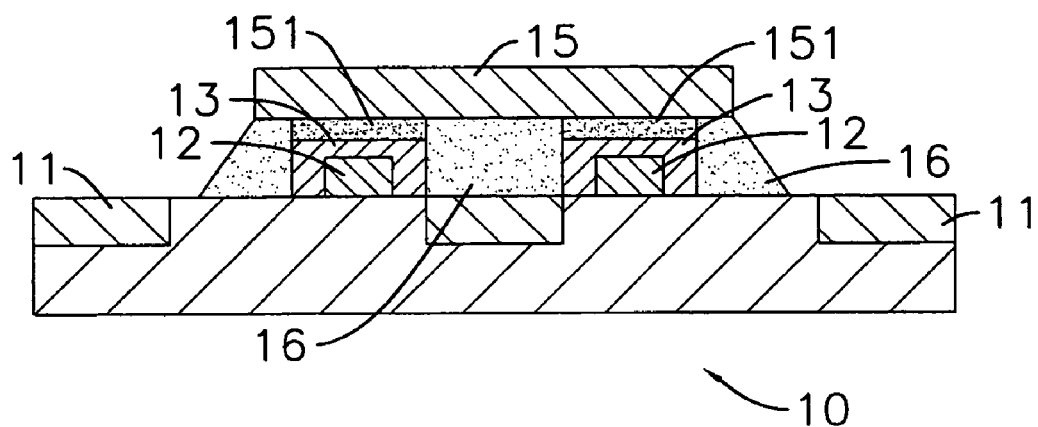
FIG. 5 is a cross sectional side view of an intermediate product formed during the packaging method for an IC and LED after the intermediate product in FIG. 4.
Figure 6:
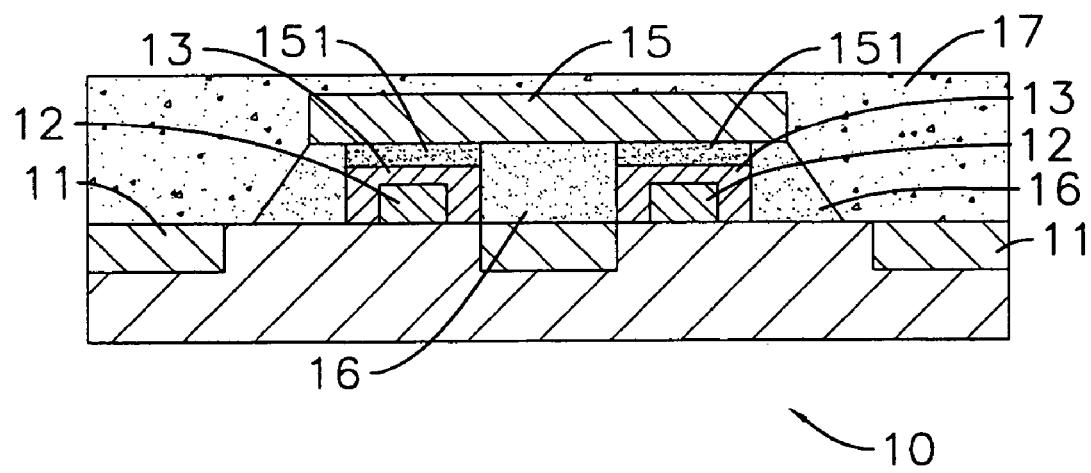
FIG. 6 is a cross sectional side view of an intermediate product formed during the packaging method for an IC and LED after the intermediate product in FIG. 5.
Figure 7:
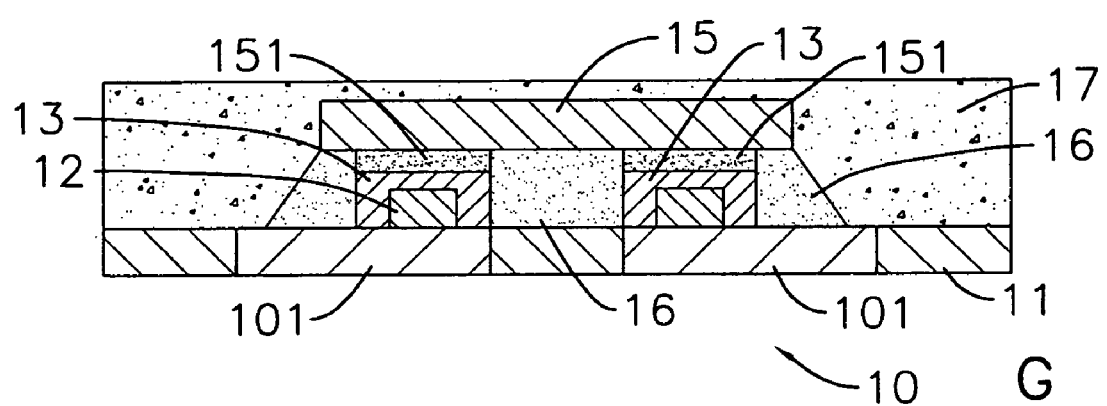
FIG. 7 is a cross sectional side view of an intermediate product formed during the packaging method for an IC and LED after the intermediate product in FIG. 6.
Figure 8:
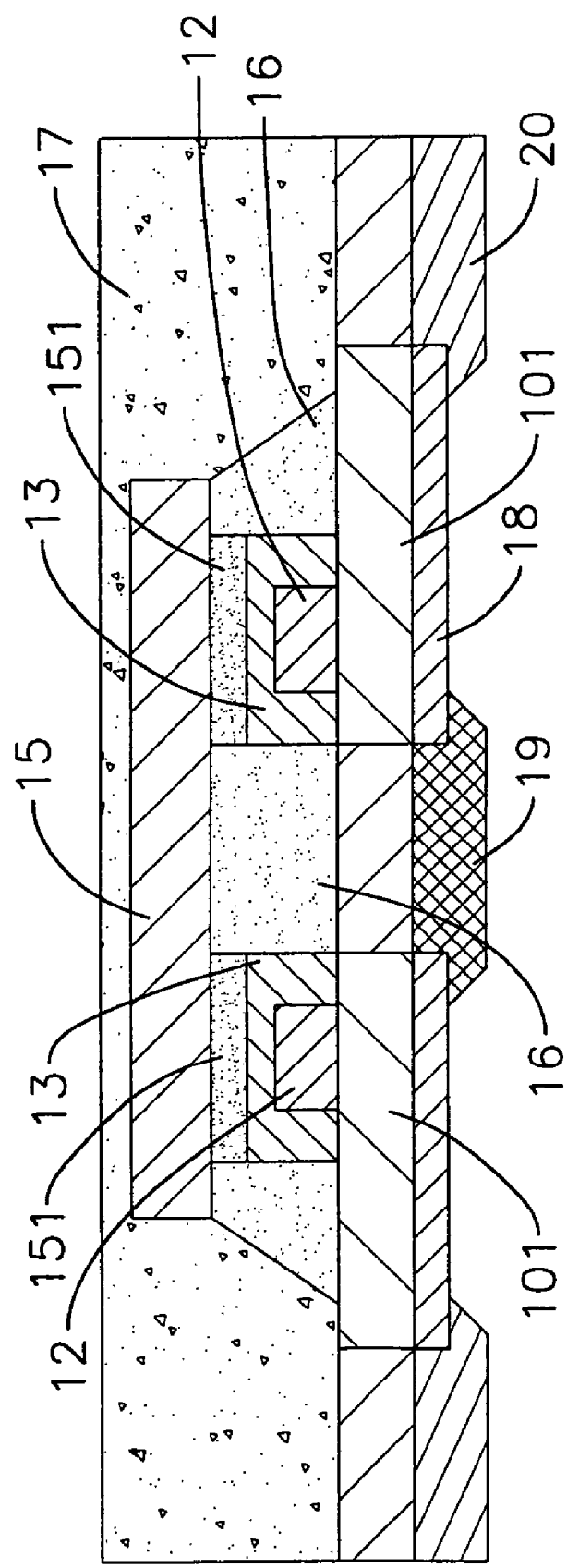
FIG. 8 is a cross sectional side view of an IC or LED device formed with the packaging method used to form the intermediate products in FIGS. 1 to 7.
Figure 9:
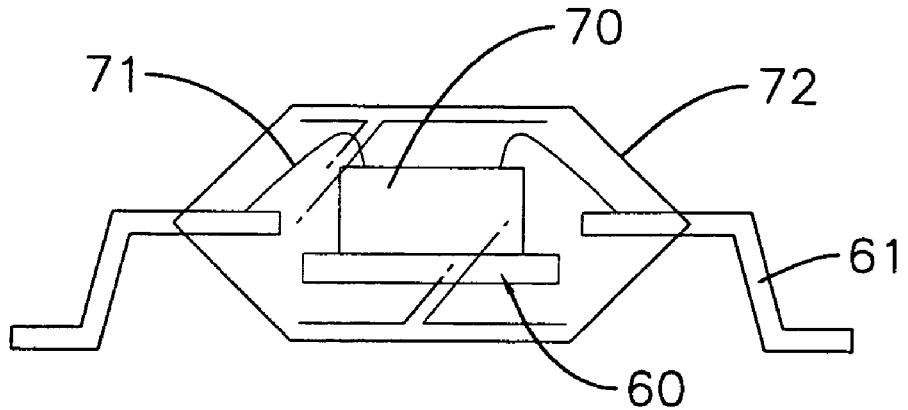
FIG. 9 is a front view of an IC device fabricated using a conventional packaging method in accordance with the prior art.
Figure 10:
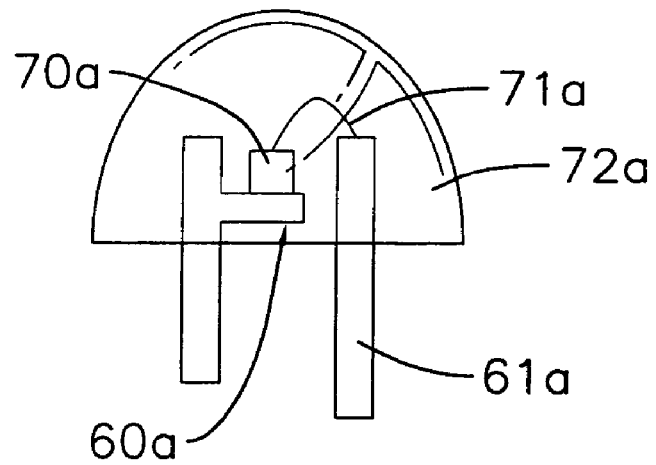
FIG. 10 is a side view of an LED device fabricated using a conventional packaging method in accordance with the prior art.
Figure 11:
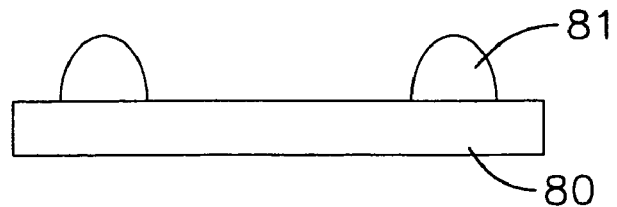
FIG. 11 is a side view of a die with solder balls used in a conventional flip-chip packaging method in accordance with the prior art.
Figure 12:
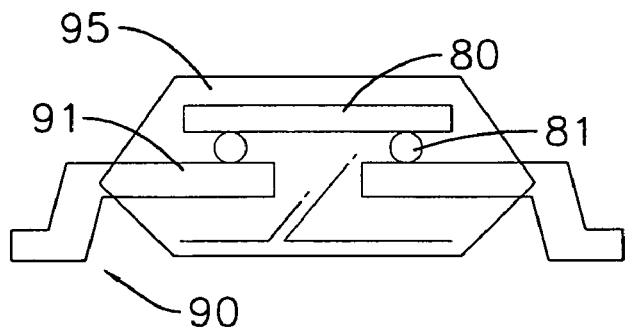
FIG. 12 is a side view of an IC element fabricated with the conventional flip-chip packaging method and using the die in FIG. 11.
Figure 13:
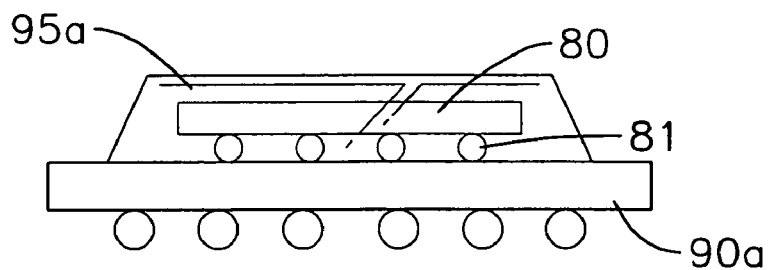
FIG. 13 is a side view of another IC element fabricated with the conventional flip-chip packaging method and using the die in FIG. 11.

With reference to FIGS. 8, a packaging method for an integrated circuit (IC) and light emitting diode (LED) comprises:

(A) etching portions of a top surface of a metal board (10) made of copper to form several recesses between raised unetched segments (FIG. 1) and filling the recesses with a dielectric material (11) of high metal density polymer (FIG. 2);

(B) forming multiple metal or solder balls (12) on the raised unetched segments by plating or printing (FIG. 3);

(C) coating the solder balls (12) with a thin metal paste layer (13) made of silver (Ag) or tin (Sn) flux (FIG. 4);

(D) bonding contacts (151) on an IC or LED die (15) respectively to the solder balls (12) with the thin metal paste layer (13) (FIG. 5);

(E) injecting an underfill (16) between the die (15) and the metal board (10) (FIG. 5);

(F) sealing the die (15) with an outer encapsulant (17) (FIG. 6); when the die (15)is an LED, the outer encapsulant (17) is transparent to allow light from the LED to radiate outward;

(G) etching a bottom surface of the metal board (10) to form multiple metal leads (101) (FIG. 7);

(H) optionally coating the metal leads (101) with a metal layer (18) of a nickel (Ni) and gold (Au) alloy and attaching an isolator (19) between the metal leads (101) to prevent reverse currents or static electricity from damaging the die (15) (FIG. 8);

(I) coating the bottom surface of the metal board (10) other than the metal leads (101) with a solder resist (20); and (J) conducting a continuity test.

The packaging method for an IC or LED in accordance with the present invention has the following improvements:

1. The multiple solder balls (12) are not formed directly on the IC or LED die (15) in the packaging method in accordance with the present invention and manufacturers do not need to open a specific production line or buy extra processing equipment.

2. Since the solder balls (12) are not formed directly on the fragile die (15), the packaging method in accordance with the present invention can be can be used with any types of dies (15) and has a good applicability.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A packaging method for an electronic element, comprising the steps of:

etching portions of a top surface of a metal board made of copper to form several recesses between raised unetched segments and filling the recesses with a dielectric material of high metal density polymer while keeping the raised unetched segments exposed;

forming multiple solder balls in contact with the raised unetched segments by plating;

coating the solder balls with a thin metal paste layer;

bonding contacts on a die respectively to the solder balls with the thin metal paste layer;

injecting an underfill between the die and the metal board;

sealing the die with an outer encapsulant;

etching a bottom surface of the metal board to form multiple metal leads;

coating the metal leads with a metal layer;

attaching an isolator between the metal leads;

coating the bottom surface of the metal board other than the metal leads with a solder resist; and conducting a continuity test.

2. The packaging method as claimed in claim 1, wherein multiple contacts of the die correspond to the multiple solder balls when bonding the die, and then attaching an underfill between the die and the metal board.

3. The packaging method as claimed in claim 1, wherein the die is for an IC.

4. The packaging method as claimed in claim 1, wherein the die is for a LED and the outer encapsulant is transparent.

5. The packaging method as claimed in claim 1, wherein the metal layer comprises an alloy of nickel (Ni) and gold (Au).

6. The packaging method as claimed in claim 1, wherein the thin metal paste layer is made of silver (Ag).

7. The packaging method as claimed in claim 1, wherein the thin metal paste layer is made of a silver (Ag).

8. The packaging method as claimed in claim 1, wherein the thin metal paste layer is made of tin (Sn).

9. The packaging method as claimed in claim 1, wherein the thin metal paste layer is made of tin (Sn).

10. A packaging method for an electronic element, comprising the steps of:

etching portions of a top surface of a metal board made of copper to form several recesses between raised unetched segments and filling the recesses with a dielectric material of high metal density polymer while keeping the raised unetched segments exposed;

forming multiple solder balls in contact with the raised unetched segments by printing;

coating the solder balls with a thin metal paste layer;

bonding contacts on a die respectively to the solder balls with the thin metal paste layer;

injecting an underfill between the die and the metal board;

sealing the die with an outer encapsulant;

etching a bottom surface of the metal board to form multiple metal leads;

coating the metal leads with a metal layer;

attaching an isolator between the metal leads;

coating the bottom surface of the metal board other than the metal leads with a solder resist; and conducting a continuity test.

* * * * *